US011158358B2

(12) United States Patent
Boniardi et al.

(10) Patent No.: US 11,158,358 B2
(45) Date of Patent: Oct. 26, 2021

(54) ADAPTIVE WRITE OPERATIONS FOR A MEMORY DEVICE

(71) Applicant: Micron Technology, Inc., Boise, ID (US)

(72) Inventors: Mattia Boniardi, Cormano (IT); Richard K. Dodge, Santa Clara, CA (US); Innocenzo Tortorelli, Cernusco sul Naviglio (IT); Mattia Robustelli, Milan (IT); Mario Allegra, Monza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/518,876

(22) Filed: Jul. 22, 2019

(65) Prior Publication Data

US 2021/0027813 A1    Jan. 28, 2021

(51) Int. Cl.
*G11C 7/10*        (2006.01)
(52) U.S. Cl.
CPC .......... *G11C 7/1096* (2013.01); *G11C 7/1051* (2013.01)
(58) Field of Classification Search
CPC ............................ G11C 7/1096; G11C 7/1051
See application file for complete search history.

(56) References Cited

U.S. PATENT DOCUMENTS

| | | | |
|---|---|---|---|
| 6,141,260 A | 10/2000 | Ahn et al. | |
| 2002/0154533 A1 | 10/2002 | Matsushita | |
| 2002/0159307 A1 | 10/2002 | Hasegawa et al. | |
| 2009/0003044 A1* | 1/2009 | Happ | G11C 13/0004 365/163 |
| 2015/0380086 A1* | 12/2015 | Park | G11C 13/0011 365/148 |
| 2016/0314847 A1 | 10/2016 | Yang | |
| 2018/0166151 A1 | 6/2018 | Mariani et al. | |
| 2020/0201573 A1* | 6/2020 | Kwak | G06F 3/0604 |

OTHER PUBLICATIONS

ISA/KR, International Search Report and Written Opinion of the International Searching Authority, Int'l Appl. No. PCT/US2020/036983, dated Sep. 17, 2020, Korean Intellectual Property Office, Seo-gu, Daejeon, Republic of Korea, 10pgs.

\* cited by examiner

*Primary Examiner* — Tri M Hoang
(74) *Attorney, Agent, or Firm* — Holland & Hart LLP

(57) ABSTRACT

Methods, systems, and devices for adaptive write operations for a memory device are described. In an example, the described techniques may include identifying a quantity of access operations performed on a memory array, modifying one or more parameters for a write operation based on the identified quantity of access operations, and writing logic states to the memory array by performing the write operation according to the one or more modified parameters. In some examples, the memory array may include memory cells associated with a configurable material element, such as a chalcogenide material, that stores a logic state based on a material property of the material element. In some examples, the described techniques may at least partially compensate for a change in memory material properties due to aging or other degradation or changes over time (e.g., due to accumulated access operations).

19 Claims, 8 Drawing Sheets

ADAPTIVE WRITE OPERATIONS FOR A MEMORY DEVICE

BACKGROUND

The following relates generally to memory devices and more specifically to adaptive write operations for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory (SSM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices may include increasing memory cell density, increasing read/write speeds, increasing reliability, increasing data retention, reducing power consumption, or reducing manufacturing costs, among other metrics. In some applications, material characteristics or responsive behaviors of memory cells may change over time, which may affect performance of a memory device.

DETAILED DESCRIPTION

Figure 1:
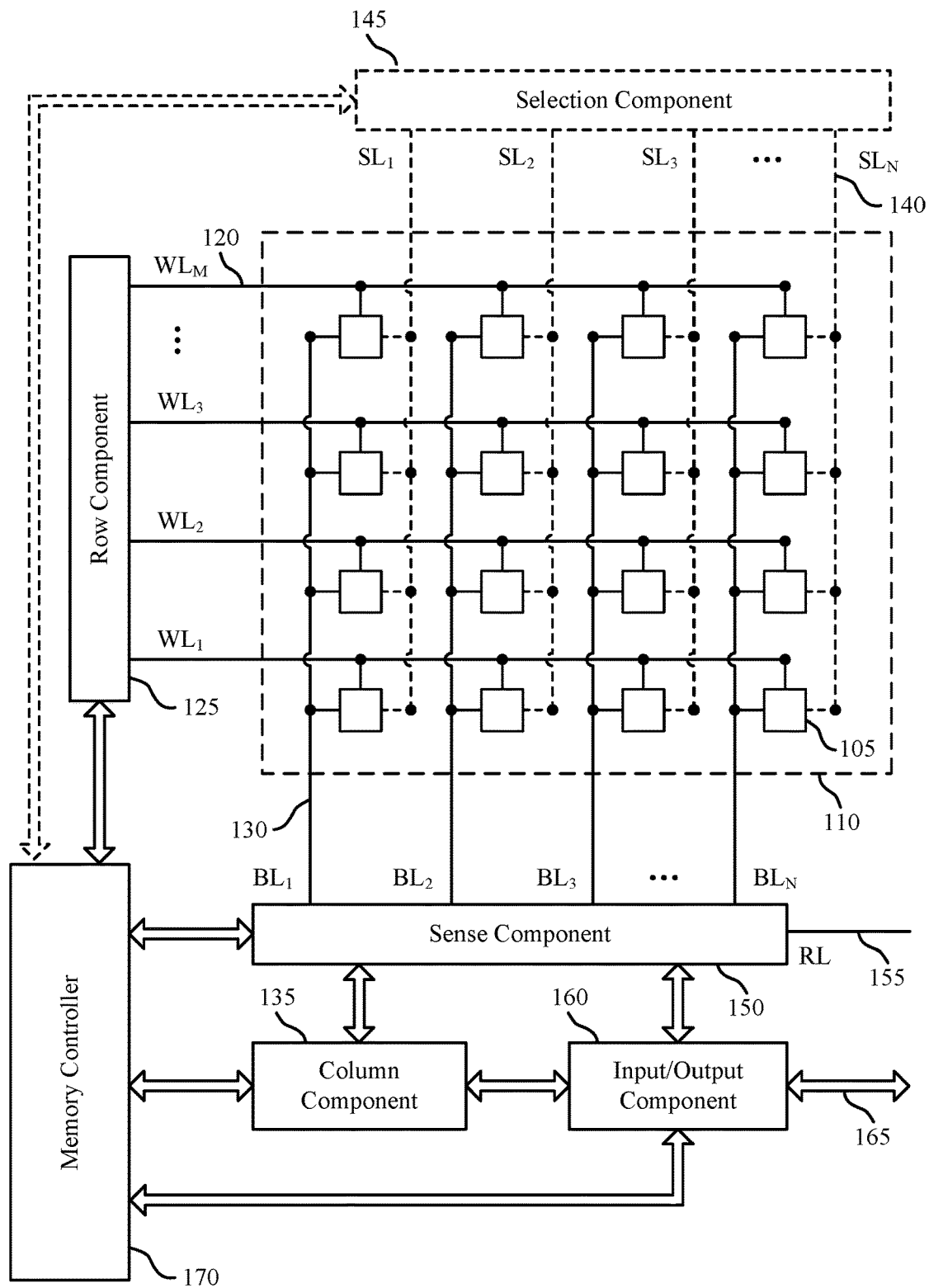
FIG. 1 illustrates an example of a memory device that supports adaptive write operations in accordance with examples as disclosed herein.

In some memory devices, a memory cell architecture may store a logic state in a configurable material (e.g., in a physical characteristic or property of the material), such as a chalcogenide. For example, different material characteristics or properties of a material may be configurable based on aspects of a write operation, and differences in the material characteristics or properties may be detected during a read operation to distinguish whether a memory cell was written with one logic state or another (e.g., a logic 0 or a logic 1). In some examples, a logic state stored by a configurable material may be based at least in part on a polarity of a voltage across the configurable material during a write operation. In some examples, a logic state stored by a configurable material may be based at least in part on a direction of current applied through a configurable material during a write operation, or a combination of a polarity of a voltage across the configurable material and a direction of current applied through a configurable material during a write operation.

In some examples, the polarity used for programming may be accompanied by a particular behavior or characteristic of a configurable material, such as a threshold voltage of the material, which may be used to detect a logic state stored by the memory cell (e.g., in a read operation). For example, one polarity of a write operation may be associated with a relatively high threshold voltage of the configurable material (e.g., for a particular read operation, for a particular read voltage), whereas another polarity of a write operation may be associated with a relatively low threshold voltage of the configurable material (e.g., for the particular read operation, for the particular read voltage). In such examples, a presence or absence of current through the material in response to a read voltage applied across the material may be used to determine (e.g., distinguish) whether the memory cell was written with one polarity or another, thereby providing an indication of the logic state that was written to the memory cell.

In some memory applications, material characteristics, material properties, or responsive behaviors of a configurable material may change or migrate over time (e.g., due to aging, wear, degradation, compositional changes or migrations, changes in operating conditions such as temperature, or other changes). For example, as a configurable material accumulates access operations (e.g., write operations, read operations, cycles), the response of the configurable material to a given write operation may change. In one example, as a configurable material accumulates access operations, a programmed threshold voltage may migrate (e.g., decrease, decay) in response to a given write operation (e.g., a write operation according to a particular pulse amplitude and particular pulse duration). Additionally or alternatively, when a temperature of a configurable material changes, a programmed threshold voltage in response to a given write operation may also change or migrate. Such a migration in threshold voltage may reduce read margins in architectures that rely on a fixed read voltage to distinguish one logic state from another (e.g., as the threshold voltage for a logic state migrates towards the fixed read voltage). Although a read voltage may be changed (e.g., decreased) in response to, or to otherwise compensate for such a decay or other migration, allowing threshold voltages of the configurable material to migrate may be accompanied by other adverse effects, such as inadvertent selection or thresholding of non-target memory cells (e.g., due to relatively lower threshold voltages when the migration relates to a decrease in threshold voltages).

In accordance with aspects of the present disclosure, a write operation may be adjusted over the course of operating a memory device to compensate for aging, wear, degradation, or other changes or migrations in a configurable material used to store logic states. For example, to compensate for a decrease in threshold voltage of a configurable material in response to a write operation with particular parameters, the parameters of a write operation may be modified in a manner that results in relatively higher threshold voltages (e.g., to maintain or stabilize threshold voltages over time). In one example, a write operation may be reconfigured, based on identifying that a quantity of access operations has satisfied (e.g., met or exceeded) a threshold, to have a higher pulse amplitude (e.g., a higher current magnitude), a shorter pulse duration, or both. In examples where the polarity of a write operation is used to distinguish one logic state from another, the reconfiguration of write operations may be applied according to different polarities (e.g., different voltage polarities across a memory cell to accompany a shorter and higher-amplitude write pulse, shorter and higher-amplitude write pulses in different directions across a memory cell).

Modifications to write operations in accordance with the described techniques may also be performed based on additional factors. In one example, modifications may be performed serially over time to further compensate for ongoing aging or degradation. In another example, modifications may be performed according to detected conditions in different portions of a memory device, which may compensate for portions of the memory device that may age differently. In another example, modifications may be performed differently for different logic states, which may compensate for a configurable material that ages, degrades, or otherwise changes differently (e.g., more strongly, more quickly) with respect to storing one logic state relative to another. Accordingly, various examples of the described techniques may be used to compensate for various migration of material characteristics or responsive behaviors of a configurable material used to store information in a memory device, which may improve the performance of a memory device.

Features of the disclosure are initially described in the context of memory systems and circuitry with reference to FIG. 1. Features of the disclosure are further described in the context of threshold voltage migration and write pulse modification with reference to FIGS. 2-4. These and other features of the disclosure are further illustrated by and described with reference to an apparatus diagram and flowcharts that relate to adaptive write operations for a memory device as described with references to FIGS. 5-8.

FIG. 1 illustrates an example of a memory device 100 that supports adaptive write operations in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, which may be denoted as a logic 0 and a logic 1. In some cases, a memory cell 105 may be programmable to store more than two logic states. In the example of memory device 100, different logic states may be programmed by writing memory cells 105 having configurable material characteristics or material properties that correspond to different logic states, where such material characteristics or material properties (e.g., material states) may be detected during a subsequent read operation to identify a stored logic state.

The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip), or a set or bank of more than one contiguous tile of memory cells. In some examples, a memory section 110 or a memory tile may refer to the smallest set of memory cells 105 that may be biased in an access operation, or a smallest set of memory cells 105 that share a common node (e.g., a common source node, a common source plate, a set of source lines that are biased to a common voltage). Although a single memory section 110 of the memory device 100 is shown, various examples of a memory device in accordance with the present disclosure may have multiple memory sections 110. In one illustrative example, a memory device 100, or a subsection thereof (e.g., a core of a multi-core memory device 100, a chip of a multi-chip memory device) may include 32 "banks" and each bank may include 32 sections. Thus, a memory device 100, or subsection thereof, according to the illustrative example may include 1,024 memory sections 110.

In the example of memory device 100, a memory cell 105 may include or otherwise be associated with a configurable material, which may be referred to as a memory element, a memory storage element, a material element, a material memory element, a material portion, a polarity-written material portion, and others. The configurable material may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics. In some examples, such characteristics may be associated with different electrical resistances, different threshold voltages, or other properties that are detectable or distinguishable during a read operation to identify a logic state stored by the configurable material.

In some examples, a characteristic or property of such a material may be configurable based at least in part on a polarity of a voltage (e.g., an orientation of an electric field) across the material during a write operation. For example, the configurable material may be associated with different electrical resistances or threshold characteristics depending on a polarity of a voltage during the write operation. In one example, a state of the configurable material after a write operation with a negative voltage polarity may have a relatively low electrical resistance or threshold voltage (e.g., corresponding to a "SET" material state, which may correspond to a logic 0), whereas a state of the material after a write operation with a positive voltage polarity may have a relatively high electrical resistance or threshold voltage (e.g., corresponding to a "RESET" material state, which may correspond to a logic 1). In some cases, a relatively high or low resistance or threshold voltage of a written memory cell 105 may be associated with or be otherwise based at least in part on a polarity of a voltage applied during a read operation. For example, a configurable material of a memory cell 105 having a relatively high or low resistance or threshold voltage may be dependent on whether a read operation performed on the memory cell 105 has a same polarity, or a different polarity (e.g., an opposite polarity), as a preceding write operation.

In some cases, a configurable material of a memory cell 105 may be associated with a threshold voltage, which may depend on the polarity of a write operation. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, depending on whether a configurable material portion of the memory cell 105 was written with a positive polarity or a negative polarity. Accordingly, the magnitude of current, or other characteristic (e.g., resistance breakdown behavior, snapback behavior) associated with the current, that results from applying a read voltage to the memory cell 105 may be used to determine a logic state stored by memory cell 105.

In the example of memory device 100, each row of memory cells 105 of the memory section 110 may be coupled with one of a set of first access lines 120 (e.g., a word line (WL), such as one of $WL_1$ through $WL_M$), and each column of memory cells 105 may be coupled with one of a set of second access lines 130 (e.g., a bit line (BL), such as one of $BL_1$ through $BL_N$). The plurality of first access lines 120 may be coupled with a row component 125, which may control various operations such as activating or biasing one or more of the plurality of first access lines 120, or selectively coupling one or more of the plurality of first access lines 120 with a voltage source, current source, or other circuit element. The plurality of second access lines 130 may be coupled with a sense component 150, which may support the detection of logic states stored by memory cells 105. In some examples, a sense component 150 may be in communication with a column component 135, or may include or be otherwise co-located with a column component 135, where a column component 135 may control various operations such as activating or biasing one or more of the plurality of second access lines 130, or selectively coupling one or more of the plurality of second access lines 130 with a voltage source, current source, or other circuit element. In some cases, first access lines 120 and second access lines 130 may be substantially perpendicular to one another in the memory device 100 (e.g., when viewing a plane of a deck, layer, or level of the memory device 100, as shown in FIG. 1). References to word lines and bit lines, or their analogues, are interchangeable without loss of understanding or operation.

In general, one memory cell 105 may be located at the intersection of (e.g., coupled with, coupled between) a first access line 120 and a second access line 130. This intersection, or an indication of this intersection, may be referred to as an address of a memory cell 105. A target or selected memory cell 105 may be a memory cell 105 located at the intersection of a biased or otherwise selected first access line 120 and a biased or otherwise selected second access line 130. In other words, a first access line 120 and a second access line 130 may be biased or otherwise selected to access (e.g., read, write, rewrite, refresh) a memory cell 105 at their intersection. Other memory cells 105 that are not at the intersection of a target memory cell 105 may be referred to as non-target or non-selected memory cells 105.

In some examples, the memory cells 105 of the memory section 110 may also be coupled with one of a plurality of third access lines 140 (e.g., a selection line (SL), such as one of $SL_1$ through $SL_N$). The plurality of third access lines 140 may be coupled with a selection component 145, which may control various operations such as activating or biasing one or more of the plurality of third access lines 140, or selectively coupling one or more of the plurality of third access lines 140 with a voltage source, current source, or other circuit element. In some examples, a third access line 140 may be coupled with a cell selection component (e.g., a transistor, a switching component) associated with respective memory cells 105, where such a cell selection component may be configured to selectively couple the memory cell 105 with an associated first access line 120, or associated second access line 130, or selectively permit or suppress current flow through the respective memory cell 105 (e.g., between a first access line 120 and a second access line 130).

Although the plurality of third access lines 140 of the memory device 100 are shown as being parallel with the plurality of second access lines 130, in other examples, a plurality of third access lines 140 may be parallel with the plurality of first access lines 120, or in any other configuration. For example, in the example of memory device 100, each of the third access lines 140 may correspond to a respective one of the second access lines 130. In another example, each of the third access lines 140 may correspond to a respective one of the first access lines 120. In another example, cell selection operations (e.g., biasing a cell selection line, activating cell selection components of one or more memory cells 105), where implemented, may be performed or otherwise supported by the row component 125 (e.g., for selecting or activating cell selection components of a row or page of memory cells 105), and the selection component 145 may be replaced by, or otherwise perform operations related to a source driver for biasing third access lines 140, which may correspond to individually-controllable source lines, a common source plate, or a common source node.

In other examples, the third access lines 140 and the selection component 145 may be omitted from a memory device 100, and accessing memory cells 105 may rely on self-selecting properties of the memory cells 105. For example, the row component 125 and the column component 135 may support fully-decoded operations, where each of the first access lines 120 and each of the second access lines 130 may be individually biased (e.g., in a cross-point configuration). In such examples, accessing memory cells 105 may rely on a self-selecting characteristic of a target memory cell 105 that may be activated based on a voltage, between an activated first access line 120 and activated second access line 130 associated with the target memory cell 105, exceeding a threshold voltage. In various examples, such a self-selecting characteristic may be supported by the logic-storing configurable material element of a memory cell 105, or may be supported by a material portion of a memory cell 105 that is different from a logic-storing portion.

In some examples, a first access line 120 may provide access to one area (e.g., one side, one end) of the configurable material portion of a memory cell 105, and a second access line 130 may provide access to another area (e.g., a different side, an opposite side, an opposite end) of the configurable material portion of the memory cell 105. For example, first access lines 120 may be located above the memory cells 105 (e.g., relative to a substrate) and second access lines 130 may be located below the memory cells 105 (e.g., relative to the substrate), or vice versa. Thus, a first access line 120 and a second access line 130 may support applying voltage or current across a configurable material portion of a memory cell 105 with different polarities (e.g., a first polarity when a voltage of a first access line 120 is higher than a voltage of a second access line 130, a second polarity when a voltage of a first access line 120 is lower than a voltage of a second access line 130). Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein.

Access operations such as reading, writing, rewriting, and refreshing may be performed on a memory cell 105 by activating or selecting a first access line 120, a second access line 130, or a third access line 140 (e.g., where present) that are coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, silicon (e.g., polycrystalline or amorphous) or other conductive or semi-conductive materials, alloys, or compounds. Upon selecting a memory cell 105, a resulting signal (e.g., a cell access signal, a cell read signal) may be used to determine the logic state stored by the memory cell 105. For example, a memory cell 105 with a configurable material portion storing a logic state may be read by applying a read voltage or bias across the memory cell 105, and the resulting flow of current via an access line (e.g., via a second access line 130), or lack thereof, or other characteristic of current flow may be detected, converted, or amplified to determine the programmed logic state stored by the memory cell 105.

Accessing memory cells 105 may be controlled through a row component 125 (e.g., a row decoder), a column component 135 (e.g., a column decoder), or a selection component 145 (e.g., a cell selection driver or a source driver, when included in a memory device 100), or a combination thereof. For example, a row component 125 may receive a row address from the memory controller 170 and select, activate, or bias the appropriate first access line 120 based on the received row address. Similarly, a column component 135 may receive a column address from the memory controller 170 and select, activate, or bias the appropriate second access line 130. Thus, in some examples, a memory cell 105 may be accessed by selecting or activating a first access line 120 and a second access line 130. In various examples, any one or more of the row component 125, the column component 135, or the selection component 145 may be referred to as, or otherwise include access line drivers, access line decoders, access line multiplexers, or other circuitry.

In some examples, the memory controller 170 may control the operation (e.g., read operations, write operations, rewrite operations, refresh operations) of memory cells 105 through the various components (e.g., a row component 125, a column component 135, selection component 145, a sense component 150). In some cases, one or more of a row component 125, a column component 135, a selection component 145, or a sense component 150 may be co-located or otherwise considered to be included with the memory controller 170. In some examples, one or more of a row component 125, a column component 135, or the sense component 150 may be otherwise co-located (e.g., in common circuitry, in a common portion of the memory device 100). In some examples, any one or more of a row component 125, a column component 135, or a selection component 145 may be referred to as a memory controller or circuitry for performing access operations of the memory device 100. In some examples, any one or more of a row component 125, a column component 135, or a selection component 145 may be described as controlling or performing operations for accessing a memory device 100, or controlling or performing operations for accessing the memory section 110 of the memory device 100.

The memory controller 170 may generate row and column address signals to activate a target first access line 120 and a target second access line 130. The memory controller 170 may also generate or control various voltages or currents used during the operation of memory device 100. Although a single memory controller 170 is shown, a memory device 100 may have more than one memory controller 170 (e.g., a memory controller 170 for each of a set of memory sections 110 of a memory device 100, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions or different functions.

Although the memory device 100 is illustrated as including a single row component 125, a single column component 135, and a single selection component 145, other examples of a memory device 100 may include different configurations to accommodate a memory section 110 or a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110. Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110.

A configurable material of a memory cell 105 may be set or written or refreshed by biasing various combinations of the associated first access line 120, second access line 130, or third access line 140 (e.g., via a memory controller 170). In other words, a logic state may be stored in the configurable material of a memory cell 105 (e.g., via a cell access signal, via a cell write signal). A row component 125, a column component 135, or a selection component 145 may accept data, for example, via input/output component 160, to be written to the memory cells 105. In some examples, a write operation may be performed at least in part by a sense component 150, or a write operation may be configured to bypass a sense component 150 (e.g., being performed by a column component 135). The configurable material of a memory cell 105 may be written with a logic state that is based at least in part on a polarity of a write voltage across the memory cell 105, which, in some examples, may be accompanied by a write current (e.g., based at least in part on the write voltage, driven by a current source).

A configurable material of a memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of (e.g., based at least in part on) the logic state stored by the memory cell 105 to one or more components (e.g., to the column component 135, the input/output component 160, the memory controller 170). In some examples, the detected logic state may be provided to a host device (e.g., a device that uses the memory device 100 for data storage, a processor coupled with the memory device 100 in an embedded application), where such signaling may be provided directly from the input/output component (e.g., via I/O line 165) or via the memory controller 170. In various memory devices 100, a sense component 150 may be shared among a set or bank of memory sections 110 (e.g., having subcomponents common to all of the set or bank of memory sections 110, having subcomponents dedicated to respective ones of the set or bank of memory sections 110), or a sense component 150 may be dedicated to one memory section 110 of a set or bank of memory sections 110.

During or after accessing a memory cell 105, the configurable material portion of a memory cell 105 may or may not permit electrical charge or current to flow via its corresponding access lines 120 or 130 (e.g., in response to a read voltage). Such charge or current may result from biasing, or applying a voltage, to the memory cell 105 from one or more voltage sources or supplies (not shown) of the memory device 100, where voltage sources or supplies may be part of a row component 125, a column component 135, a sense component 150, a memory controller 170, or some other component (e.g., a biasing component). In some examples (e.g., in a memory architecture that includes cell selection components), the described biasing may be supported by an activation of a cell selection component of a target memory cell 105, a deactivation of a cell selection component of a non-target memory cell 105, or both.

In some examples, when a read bias (e.g., a read pulse, a read current, a read voltage) is applied across a memory cell 105 with a configurable material storing a first logic state (e.g., a "SET" material state, associated with a first write polarity), the memory cell 105 may conduct current due to the read bias exceeding a threshold voltage of the memory cell 105. In response to, or based at least in part on this, the sense component 150 may therefore detect a current through the memory cell 105 (e.g., via a second access line 130) as part of determining the logic state stored by the memory cell 105. When a read bias is applied to the memory cell 105 with the configurable material storing a second logic state (e.g., a "RESET" material state, associated with a second write polarity different than the first write polarity), the memory cell 105 may not conduct current due to the read bias not exceeding the threshold voltage of the memory cell 105. The sense component 150 may therefore detect little or no current through the memory cell 105 as part of determining the stored logic state.

In some examples, a reference current may be defined for sensing the logic state stored by a memory cell 105. The reference current may be set above a current that passes through the memory cell 105 when the memory cell 105 does not threshold in response to the read bias, but equal to or below an expected current through the memory cell 105 when the memory cell 105 does threshold in response to the read bias. For example, the reference current may be higher than a leakage current of the associated access lines 120 or 130 (e.g., higher than a leakage current associated with one or more memory cells 105 coupled with an access line 120 or 130 that is common with a target memory cell 105). In some examples, a logic state stored by a memory cell 105 may be determined based at least in part on a voltage (e.g., across a shunt resistance) resulting from the current driven by a read pulse. For example, the resulting voltage may be compared relative to a reference voltage (e.g., as generated within the sense component 150 or provided via a reference line (RL) 155), with a resulting voltage less than the reference voltage corresponding to a first logic state and a resulting voltage greater than the reference voltage corresponding to a second logic state.

In some examples, more than one voltage or current may be applied when reading a memory cell 105 (e.g., multiple voltages may be applied during portions of a read operation). For example, if an applied read voltage does not result in current flow, one or more other read voltages or voltage polarities may be applied (e.g., until a current is detected by sense component 150). Based at least in part on assessing the read voltage that resulted in current flow, the stored logic state of the memory cell 105 may be determined. In some cases, a read voltage or current may be ramped (e.g., smoothly increasing higher in magnitude) until a current flow or other condition is detected by a sense component 150. In other cases, predetermined read voltages may be applied (e.g., a predetermined sequence of read voltages that increase higher in magnitude in a stepwise manner, a predetermined sequence of read voltages that include different read voltage polarities) until a current is detected. Likewise, a read current may be applied to a memory cell 105 and the magnitude or polarity of the voltage to create the read current may depend on the electrical resistance or the total threshold voltage of the memory cell 105.

A sense component 150 may include various switching components, selection components, multiplexers, transistors, amplifiers, capacitors, resistors, voltage sources, current sources, or other components to detect, convert, or amplify a difference in sensing signals (e.g., a difference between a read voltage and a reference voltage, a difference between a read current and a reference current), which, in some examples, may be referred to as latching or generating a latch signal. In some examples, a sense component 150 may include a collection of components (e.g., circuit elements, circuitry) that are repeated for each of a set of second access lines 130 connected to the sense component 150. For example, a sense component 150 may include a separate sensing circuit or circuitry (e.g., a separate sense amplifier, a separate signal development component) for each of a set of second access lines 130 coupled with the sense component 150, such that a logic state may be separately detected for a respective memory cell 105 coupled with a respective one of the set of second access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120 or 130 of a memory section 110).

In some memory architectures, accessing a memory cell 105 may degrade or destroy a logic state stored by one or more memory cells 105 of the memory section 110, and rewrite or refresh operations may be performed to return the original logic state to the memory cells 105. In architectures that include a configurable material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a configurable material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain or rewrite stored logic states. Refreshing a memory cell 105 may reduce or eliminate read disturb errors or logic state corruption due to a change in the material state of a configurable logic storage material over time.

In some cases, material characteristics, material properties, or responsive behaviors of a configurable material associated with the memory cells 105 may change or migrate over time (e.g., due to aging, wear, degradation, compositional changes or migrations, changes in operating conditions such as temperature, or other changes). For example, as a configurable material of a memory cell 105 accumulates access operations (e.g., write operations, read operations), the response of the memory cell 105 to a given write operation may change. In one example, as a configurable material accumulates access operations, a programmed threshold voltage of the memory cell 105 may migrate in response to a given write operation (e.g., a write operation according to a pulse amplitude and pulse duration).

In accordance with examples of the present disclosure, various aspects of a write operation may be adjusted over the course of operating the memory device 100 (e.g., accessing the memory cells 105) to compensate for aging, wear, degradation, operating conditions, or other changes in a configurable material used to store logic states in the memory cells 105. For example, to compensate for a decrease in threshold voltage of a configurable material in response to a write operation with particular parameters, the memory controller 170 may modify write operations in a manner that results in relatively higher threshold voltages (e.g., to maintain a threshold voltage over time). In one example, the memory controller 170 may reconfigure write operations based on identifying that a quantity of access operations (e.g., of the memory device 100, of the memory section 110) has exceeded a threshold. Additionally or alternatively, the memory controller 170 may reconfigure write operations based on identifying some other change in operating conditions that may be associated with an actual or predicted change or migration in threshold voltages, such as identifying a change in operating temperature of the memory device 100.

More generally, a memory device 100 in accordance with examples of the present disclosure may perform write operations according to a set of parameters, identify or infer a threshold voltage migration (e.g., identify or infer that, for write operations performed according to the set of parameters, a resulting threshold voltage from the write operation has migrated or is likely to have migrated, identify conditions or characteristics associated with a threshold voltage migration), and modify the set of parameters based at least in part on the identifying or inferring. In various examples, the memory device 100 may identify or detect such a migration directly or explicitly by measuring or detecting written threshold voltages (e.g., in a diagnostic mode or other mode that monitors for threshold voltage migrations), or the memory device 100 may infer or predict such a migration based on other conditions or characteristics (e.g., based on an accumulation of access operations, based on detecting a temperature that is predicted to affect a threshold voltage written by a particular write operation, based on detecting a certain quantity or rate of errors that would suggest that a threshold voltage migration has occurred). Accordingly, according to various examples of the present disclosure, the memory device 100 may perform write operations based at least in part on the modified set of parameters, which may support the memory device 100 compensating for various sources of threshold voltage migrations, such as migrations resulting from an accumulation of access operations or other sources of wear, aging, or degradation, migrations resulting from operating conditions (e.g., instantaneous conditions that affect a particular access operation) such as operating temperature or ambient temperature, and migrations resulting from other sources.

In various examples, write operations may be modified to apply write pulses having a higher amplitude (e.g., a higher current magnitude), a shorter pulse duration, or both. In examples where the polarity of a write operation is used to distinguish one logic state from another, the reconfiguration may be applied according to different polarities (e.g., different voltage polarities across a memory cell to accompany a shorter and higher-amplitude write pulse, shorter and higher-amplitude write pulses in different directions across a memory cell).

Accordingly, various examples of the described techniques may be used to compensate for various changes or migrations of material characteristics or responsive behaviors of a configurable material used to store information in the memory device 100, which may improve the performance of a memory device 100 compared to other memory devices that do not compensate for such changes.

Figure 2:
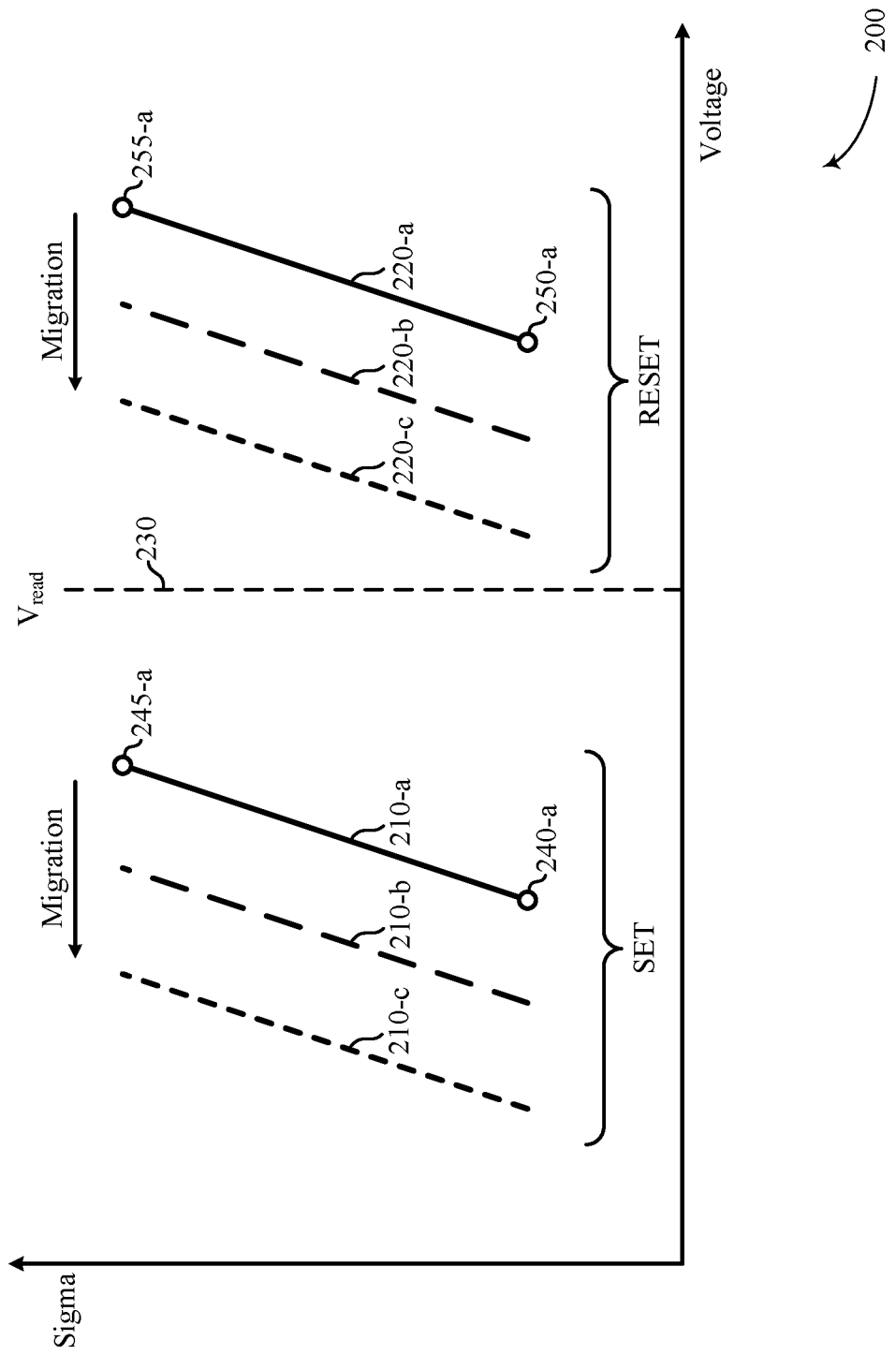
FIG. 2 illustrates a plot of threshold voltage distributions in a memory device in accordance with examples as disclosed herein.

FIG. 2 illustrates a plot 200 of threshold voltage distributions in a memory device 100 in accordance with examples as disclosed herein. The plot 200 may illustrate threshold voltage distributions of a representative population of memory cells 105 (e.g., a representative population of configurable material memory elements) of a memory device 100 with respect to the standard deviation, sigma. For illustration purposes, the sigma axis may be a nonlinear axis so that a normal distribution of threshold voltages may be illustrated as linear distributions in the plot 200.

The distributions 210 may illustrate a distribution of threshold voltages for the representative population of memory cells 105 when storing a first logic state or material state (e.g., a "SET" state). The distributions 210 may be associated with a lower boundary or edge (e.g., edge 240), which may be referred to as "E1," and an upper boundary or edge (e.g., edge 245), which may be referred to as "E2." The distributions 210 may illustrate various interpretations of a statistical distribution, such as a span of six standard deviations (e.g., six sigma), a span of twelve standard deviations (e.g., twelve sigma), or a span between a minimum and maximum threshold voltage of the representative population of memory cells 105 when storing the SET state. The distribution 210-a may illustrate an initial distribution of threshold voltages for the representative population of memory cells 105 when storing the SET state (e.g., before aging or migration of threshold voltages).

The distributions 220 may illustrate a distribution of threshold voltages for the representative population of memory cells 105 when storing a second logic state or material state (e.g., a "RESET" state). The distributions 220 may be associated with a lower boundary or edge (e.g., edge 250), which may be referred to as "E3," and an upper boundary or edge (e.g., edge 255), which may be referred to as "E4." The distributions 220 may illustrate various interpretations of a statistical distribution, such as a span of six standard deviations (e.g., six sigma), a span of twelve standard deviations (e.g., twelve sigma), or a span between a minimum and maximum threshold voltage of the representative population of memory cells 105 when storing the RESET state. The distribution 220-a may illustrate an initial distribution of threshold voltages for the representative population of memory cells 105 when storing the RESET state (e.g., before aging or migration of threshold voltages).

The plot 200 also illustrates a read voltage 230 that may be used for detecting a logic state stored by the representative population of memory cells 105. For example, referring to the initial distributions 210-a and 220-a, memory cells 105 of the representative population that store the SET state may permit a flow of current (e.g., a flow of current above a threshold amount of current) when applying the read voltage 230, because the read voltage 230 is above the threshold voltage for each of those memory cells 105 (e.g., because the distribution 210-a is below the read voltage 230). In other words, memory cells 105 in the SET state will "threshold" in response to the read voltage 230 being applied. On the other hand, memory cells 105 of the representative population that store the RESET state may not permit a flow of current when applying the read voltage 230, or may permit some flow of current that is below a threshold (e.g., a leakage current) because the read voltage 230 is below the threshold voltage for each of those memory cells 105 (e.g., because the distribution 220-a is above the read voltage 230). In other words, memory cells 105 in the RESET state may not threshold in response to the read voltage 230 being applied. Thus, in some examples, the read voltage 230 may be referred to as, or otherwise be associated with a voltage demarcation (VDM), which may refer to a demarcation between the SET and RESET state for the representative population of memory cells 105.

The plot 200 may also be illustrative of various margins that may be applicable to access operations of the representative population of memory cells 105. For example, an "E3 margin" may refer to a difference between an edge 250 of a distribution 220 (e.g., a lower edge of a distribution associated with a logic state or material state having a relatively high threshold voltage) and the read voltage 230. Generally, an E3 margin may refer to the margin against inadvertently thresholding memory cells 105 in the RESET state with a given read voltage 230 (e.g., inadvertently detecting or interpreting a SET state when reading a memory cell 105 that should store the RESET state or was written with the RESET state). Accordingly, improving an E3 margin may be associated with widening a margin between a distribution 220 and a read voltage 230 (e.g., by shifting an edge 250 to a higher voltage, by shifting a distribution 220 to higher voltages, by shifting a read voltage 230 to a lower voltage).

In another example, an "E1 margin" may refer to a difference between an edge 240 of a distribution 210 (e.g., a lower edge of a distribution associated with a logic state or material state having a relatively low threshold voltage) and a voltage that may be related to the read voltage 230 or some other applied voltage (e.g., a write voltage, a rewrite voltage, a conditioning voltage). Generally, an E1 margin may refer to the margin against inadvertently thresholding non-target memory cells 105 (e.g., in the SET state) when biasing a target memory cell 105.

For example, to bias a target memory cell 105 with the read voltage 230, half of the relative bias may be associated with access lines 120 (e.g., word lines) and half of the relative bias may be associated with access lines 130 (e.g., bit lines). In one example, a target word line may be positively biased to half the read voltage 230 (e.g., $+V_{read}/2$) and non-target word lines may be grounded (e.g., 0 Volts), and a target bit line may be negatively biased to half the read voltage 230 (e.g., $-V_{read}/2$) and non-target bit lines may be grounded (e.g., 0 Volts). In another example, a target word line may be positively biased to the full read voltage 230 (e.g., $+V_{read}$) and non-target word lines may be positively biased to half the read voltage 230 (e.g., $+V_{read}/2$), and a target bit line may be grounded (e.g., 0 Volts) and non-target bit lines may be biased to half the read voltage 230 (e.g., $+V_{read}/2$). In either example, the target memory cell 105 may be biased to the full read voltage 230, and memory cells 105 that do not share either the target word line or the target bit line may have no net bias.

However, in either of the examples above, non-target memory cells 105 that share one of the target word line or the target bit line with the target memory cell 105 may have a net bias of half the read voltage 230, which may be relevant to the edge 240 of the distribution 210-a. For example, when non-target memory cells 105 that share a target word line or a target bit line store a SET state, they may be inadvertently thresholded by half the read voltage 230 (e.g., when an edge 240 has a voltage that is lower than $V_{read}/2$). Inadvertent thresholding of a non-target memory cell 105 may result in additional current flow along a target word line or target bit line, for example, which may cause read operation errors or inaccuracies, increased power consumption, and other adverse effects. Thus, in the illustrative example, an E1 margin may relate to how far an edge 240 is above half a read voltage 230. However, an E1 margin may additionally or alternatively relate to other access voltages as well, such as write voltages or selection voltages. Accordingly, improving an E1 margin may generally be associated with shifting a distribution 210 away from biasing that may be applied to a non-target memory cell 105 (e.g., by shifting an edge 240 to a higher voltage, by shifting a distribution 210 to higher voltages, by shifting biasing that may be applied to non-target memory cells 105 to a lower voltage).

The plot 200 also illustrates an example of threshold voltage migration of the representative population of memory cells 105 over the course of operating the memory device 100. For example, as the representative population of memory cells 105 (e.g., the representative population of configurable material memory elements) accumulates cycles, such as access operations, or experiences a change in operating temperature, the ability of the memory cells 105 to develop a threshold voltage in response to a given write operation (e.g., having a particular pulse amplitude and duration) may decrease. Accordingly, under such circumstances, the distributions of threshold voltages may decrease or decay when the same write operation (e.g., write operations having the same parameters) is used.

For example, the distributions 210-a and 220-a may illustrate the threshold voltage distributions of the representative population of memory cells 105 when storing the SET state and the RESET state, respectively. After some number of access operations performed on the representative population of memory cells 105 (e.g., a quantity of write operations, read operations, or combination thereof), the threshold voltage distributions may shift or migrate to lower voltages, illustrated by the transition from distribution 210-a to 210-b, and the transition from 220-*a* to 220-*b*. In other words, as a memory device 100 operates over time, the threshold voltages of the representative population of memory cells 105 for both the SET and RESET states may shift downward. After some additional number of access operations performed on the representative population of memory cells 105 (e.g., a quantity of write operations, read operations, or combination thereof), the threshold voltage distributions may further shift or migrate to lower voltages, illustrated by the transition from distribution 210-*b* to 210-*c*, and the transition from 220-*b* to 220-*c*. In some examples, the decrease in voltage of the corresponding edge 240 may be described as an E1 migration, and the decrease in voltage of the corresponding edge 250 may be described as an E3 migration.

The migration of threshold voltages of the representative population of memory cells 105 may be accompanied by a reduction in voltage margins for the associated memory device 100. For example, as edge 250 decreases in voltage (e.g., due to E3 migration), edge 250 may become closer to, or fall below the read voltage 230, illustrating a decrease, collapse, or elimination of an E3 margin. In another example, the decrease of edge 240 (e.g., E1 migration) may be accompanied by a decrease, collapse, or elimination of an E1 margin.

In some memory devices, a read voltage 230 may be variable, and may be adjusted to compensate for threshold voltage migration (e.g., in response to detected threshold voltage migration, based on other indications of identified or predicted aging or change in operating conditions), or other effects. For example, in response to the migration from distribution 220-*a* to distribution 220-*b*, or the migration from distribution 210-*a* to distribution 210-*b*, or some other indication of such a migration, the read voltage 230 may be shifted to a lower voltage. Such a shift of the read voltage 230 may be referred to as VDM following, and may be performed to maintain an E3 margin or other margin.

However, in some examples, such a shift of the read voltage 230 may not maintain an E1 margin. For example, referring back to the illustrative example where inadvertent selection of a non-target memory cell 105 may occur at one half the read voltage 230, a shift of the read voltage 230 that maintains an E3 margin may be accompanied with a recovery of only one half an E1 margin, or some other related amount. Moreover, in some cases, an E1 margin may be associated with a voltage different from the read voltage 230 (e.g., a write voltage, a selection voltage), in which case shifting the read voltage 230 may not recover any of the E1 margin that is lost as a result in a downward shift of a distribution 210 associated with the SET state.

In accordance with examples of the present disclosure, write operations, or parameters thereof, may be modified to compensate for the effects of aging, wear, degradation, compositional changes or migrations, changes in operating conditions such as temperature, or other changes. For example, as the representative population of memory cells 105 accumulates access operations (e.g., write operations, read operations, cycles), or experiences a change in operating temperature or other operating condition, write operations may be modified in a manner that results in relatively higher threshold voltages. Thus, the distributions 210 and 220 may be maintained in a same or similar voltage range (e.g., a relatively stable range of voltages), or the illustrated migrations of the distributions 210 and 220 may be otherwise mitigated. In some examples, the adaptation of write operations may be easier in terms of device management than VDM following, and may be associated with lower power consumption and reduced logic complexity, and in some examples, the adaptation of write operations may eliminate the need for VDM following. However, in some examples, the described techniques for adaptive write operations may be combined with VDM following.

Figure 3A:
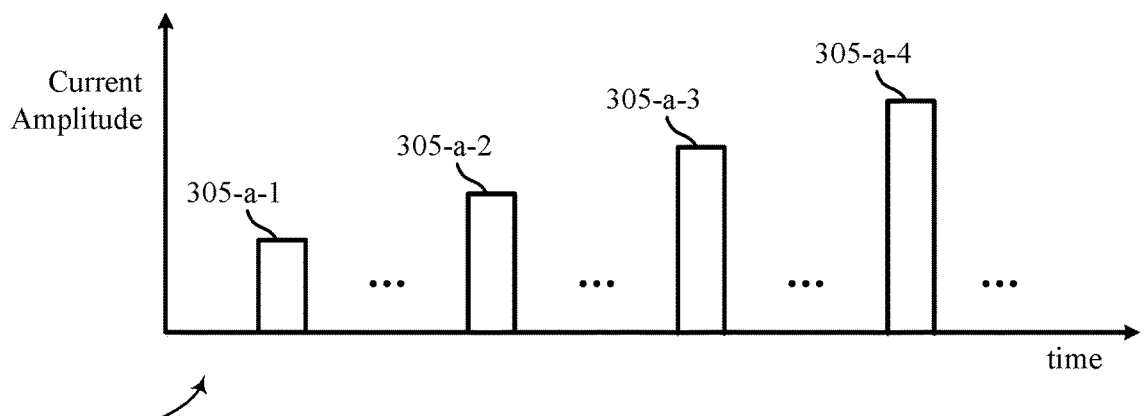
FIGS. 3A through 3C illustrate examples of write pulses that support adaptive write operations for a memory device in accordance with examples as disclosed herein.
Figure 3B:
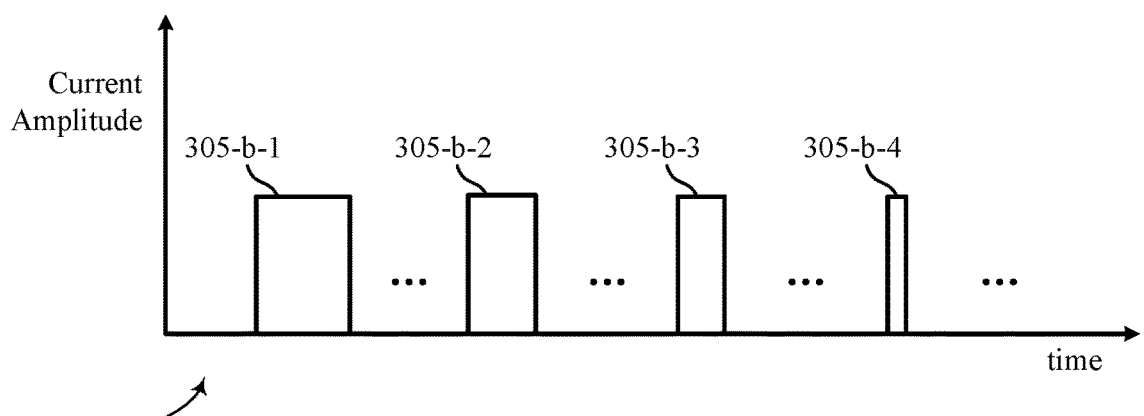
Figure 3C:
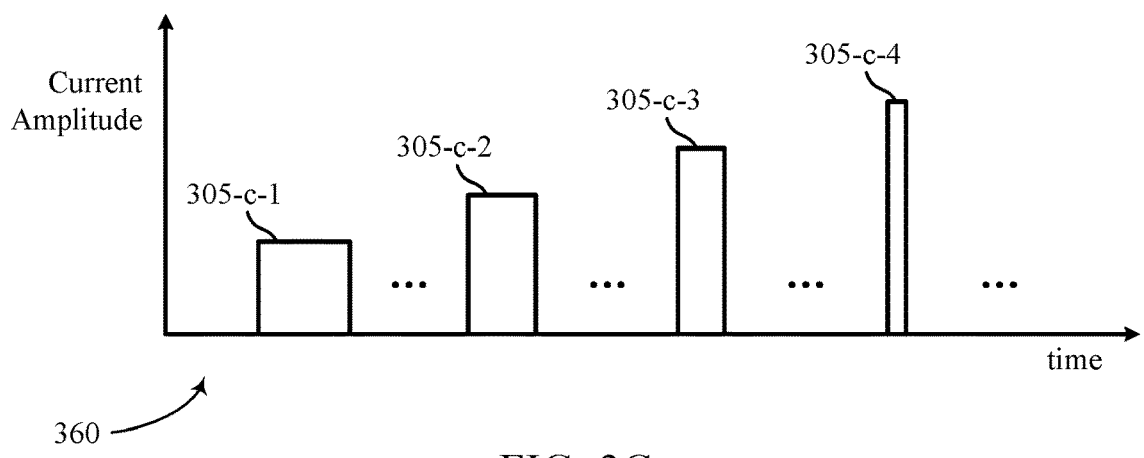

FIGS. 3A through 3C illustrate examples of write pulses 305 that support adaptive write operations for a memory device in accordance with examples as disclosed herein. In some examples, memory cells 105 that are associated with configurable material memory elements may be programmed with relatively short-duration, low-amplitude current pulses. For example, write pulses 305 for such memory cells 105, including those described with reference to FIGS. 3A through 3C, may have a duration in a range of 10-150 nanoseconds, and have an amplitude in a range of 15-65 microamps, according to one example of a memory device 100.

In some examples, write pulses 305 may be associated with different polarities for writing different logic states. For example, a write pulse 305 may be applied with a positive polarity when a word line has a higher voltage than a bit line, and a write pulse 305 may be applied with a negative polarity when a word line has a lower voltage than a bit line. However, such an interpretation of polarities may be reversed in other examples, or may be related to a direction of current applied through a memory cell 105. Thus, although the write pulses 305 described with reference to FIGS. 3A through 3C are illustrated with a current amplitude, such current may be applied in different directions through a given memory cell 105 to support the writing of different logic states.

In some examples, writing one state or another may be related to a polarity used in a subsequent read operation. For example, to write a SET state, a write pulse 305, or a write bias to drive such a write pulse 305, may be associated with a same voltage polarity as a subsequent read operation (e.g., corresponding to a relatively lower threshold voltage), and to write a RESET state, a write pulse 305, or a write bias to drive such a write pulse 305, may be associated with an opposite voltage polarity as a subsequent read operation (e.g., corresponding to a relatively higher threshold voltage). In various examples, a read voltage polarity of a memory device 100 may be fixed, or may be configurable based on a setting or mode of operation of the memory device 100. Accordingly, a polarity of write pulses 305 for writing a SET state or a RESET state may also be fixed, or may be configurable based on a setting or mode of operation of the memory device 100, but in either case may be based on the polarity of a subsequent read operation.

In each of the examples of write pulses 305 described with reference to FIGS. 3A through 3C, modifications of parameters from one write pulse 305 to another may be performed based on detected or predicted aging, which may be related to threshold voltage migration of memory cells 105 in a memory device 100. For example, such modifications may be based at least in part on identifying that a quantity of access operations performed on the memory array satisfies a threshold. In some examples, a memory device 100 may track a number of access operations performed on a set of memory cells 105 in a register, and compare the tracked number to a threshold. In other examples, changes to threshold voltages or other characteristics due to aging, cycling, or other changes in operating conditions may be otherwise predicted, inferred, or detected to support the described techniques for adaptive write operations. The modifications may be supported by a configurable current source of a memory device 100, such as a current source that may be reconfigured to support different pulse amplitudes, different pulse durations, or both.

FIG. 3A illustrates an example 300 of modifying an amplitude of write pulses 305-*a* over time. For example, an initial configuration of a memory device 100 may include write pulses 305-*a*-1 having a particular duration and current amplitude. Although only one write pulse 305-*a*-1 is illustrated, a memory device 100 may be generally configured for write operations to use the write pulse 305-*a*-1 (e.g., for writing a SET state, for writing a RESET state, or for writing either a SET state or a RESET state and applying different polarities accordingly), or write pulses 305 of other configurations. Thus, a memory device 100 may perform write operations with the write pulse 305-*a*-1, or other configuration of a write pulse 305-*a*, any number of times before modifying a duration and current amplitude (e.g., thousands of times, tens of thousands of times, hundreds of thousands of times, and so on).

In some examples, a memory device 100 may determine to modify write operations (e.g., in response to detected aging or cycling, in response to identifying that a quantity of access operations performed on the memory array satisfies a threshold, in response to detecting another change in operating condition, such as operating temperature, in response to directly detecting or indirectly inferring a change or migration in threshold voltages), which may include modifying a write configuration to use the write pulse 305-*a*-2, having a higher current amplitude (e.g., modifying a current level or amplitude of a current source). In some examples, a write pulse 305 with a higher current amplitude may be associated with memory cell 105 having a higher threshold voltage, so changing a write configuration from using the write pulse 305-*a*-1 to using the write pulse 305-*a*-2 may be associated with shifting a distribution 210, or a distribution 220, or both, to a higher voltage (e.g., compared to such distributions when using the write pulse 305-*a*-1). Accordingly, such a modification to write operations may support a compensation for threshold voltage migration in the memory device 100 (e.g., as illustrated and described with reference to FIG. 2). The example 300 illustrates that further changes may be made to a write configuration (e.g., based on later determinations of aging or cycling, based on serial modifications). For example, a write configuration may also be modified to use a write pulse 305-*a*-3 having an even greater current amplitude, and later modified to use a write pulse 305-*a*-4 having an even greater current amplitude, and so on.

FIG. 3B illustrates an example 330 of modifying a duration of write pulses 305-*b* over time. For example, an initial configuration of a memory device 100 may include write pulses 305-*b*-1 having a particular duration and current amplitude. Although only one write pulse 305-*b*-1 is illustrated, a memory device 100 may be generally configured for write operations to use the write pulse 305-*b*-1 (e.g., for writing a SET state, for writing a RESET state, or for writing either a SET state or a RESET state and applying different polarities accordingly), or write pulses 305 of other configurations. Thus, a memory device 100 may perform write operations with the write pulse 305-*b*-1, or other configuration of a write pulse 305-*b*, any number of times before modifying a duration and current amplitude (e.g., thousands of times, tens of thousands of times, hundreds of thousands of times, and so on).

In some examples, a memory device 100 may determine to modify write operations (e.g., in response to detected aging or cycling, in response to identifying that a quantity of access operations performed on the memory array satisfies a threshold, in response to detecting another change in operating condition, such as operating temperature, in response to directly detecting or indirectly inferring a change or migration in threshold voltages), which may include modifying a write configuration to use the write pulse 305-*b*-2, having a shorter duration (e.g., modifying a duration for coupling a current source with a memory cell). In some examples, a write pulse 305 with a shorter duration may be associated with memory cell 105 having a higher threshold voltage, so changing a write configuration from using the write pulse 305-*b*-1 to using the write pulse 305-*b*-2 may be associated with shifting a distribution 210, or a distribution 220, or both, to a higher voltage (e.g., compared to such distributions when using the write pulse 305-*b*-1). Accordingly, such a modification to write operations may support a compensation for threshold voltage migration in the memory device 100 (e.g., as illustrated and described with reference to FIG. 2). The example 330 illustrates that further changes may be made to a write configuration (e.g., based on later determinations of aging or cycling, based on serial modifications). For example, a write configuration may also be modified to use a write pulse 305-*b*-3 having an even shorter duration, and later modified to use a write pulse 305-*b*-4 having an even shorter duration, and so on.

FIG. 3C illustrates an example 360 of modifying a current amplitude and duration of write pulses 305-*c* over time. For example, an initial configuration of a memory device 100 may include write pulses 305-*c*-1 having a particular duration and current amplitude. Although only one write pulse 305-*c*-1 is illustrated, a memory device 100 may be generally configured for write operations to use the write pulse 305-*c*-1 (e.g., for writing a SET state, for writing a RESET state, or for writing either a SET state or a RESET state and applying different polarities accordingly), or write pulses 305 of other configurations. Thus, a memory device 100 may perform write operations with the write pulse 305-*c*-1, or other configuration of a write pulse 305-*c*, any number of times before modifying a duration and current amplitude (e.g., thousands of times, tens of thousands of times, hundreds of thousands of times, and so on).

In some examples, a memory device 100 may determine to modify write operations (e.g., in response to detected aging or cycling, in response to identifying that a quantity of access operations performed on the memory array satisfies a threshold, in response to detecting another change in operating condition, such as operating temperature, in response to directly detecting or indirectly inferring a change or migration in threshold voltages), which may include modifying a write configuration to use the write pulse 305-*c*-2, having a higher current amplitude and a shorter duration (e.g., modifying a current level or amplitude of a current source and modifying a duration for coupling the current source with a memory cell 105). In some examples, a write pulse 305 with a higher current amplitude and a shorter duration may be associated with memory cell 105 having a higher threshold voltage, so changing a write configuration from using the write pulse 305-*c*-1 to using the write pulse 305-*c*-2 may be associated with shifting a distribution 210, or a distribution 220, or both, to a higher voltage (e.g., compared to such distributions when using the write pulse 305-*c*-1). Accordingly, such a modification to write operations may support a compensation for threshold voltage migration in the memory device 100 (e.g., as illustrated and described with reference to FIG. 2). The example 360 illustrates that further changes may be made to a write configuration (e.g., based on later determinations of aging or cycling, based on serial modifications). For example, a write configuration may also be modified to use a write pulse 305-c-3 having an even higher current amplitude and shorter duration, and later modified to use a write pulse 305-c-4 having an even higher current amplitude and shorter duration, and so on.

Thus, each of the examples 300, 330, and 360 illustrate modifications to write operations that may support a compensation for threshold voltage migration in the memory device 100. Although described with reference to a write configuration according to a single write pulse 305, a memory device 100 may be configured for write operations according to more than one pulse 305 (e.g., different write pulses 305 for different subarrays of a memory device 100, different write pulses 305 for writing different logic states, a write operation for writing a logic state that includes multiple write pulses 305). In addition, although described for the example of modifying a current amplitude or duration for write pulses, voltage amplitude or duration may also be modified according to the examples 300, 330, and 360 discussed above.

In a first example, a memory device 100 may be configured to support using a different write pulse 305 for each of a plurality of subarrays (e.g., a different write pulse 305 for each memory section 110, a different write pulse 305 for each memory bank, a different write pulse 305 for each level of memory cells 105). For example, a memory device 100 may have a plurality of subarrays that are each initially configured to use the write pulse 305-c-1 for respective operations. One of the subarrays may be aged or cycled more rapidly, or may experience different operating conditions (e.g., that may be associated with different threshold voltages in response to a write operation), such as different operating temperatures, and based on identifying or detecting such conditions, write operations of the memory device 100 may accordingly be modified to use the write pulse 305-c-2 on the more-rapidly aged or cycled subarray earlier than other subarrays. Thus, according to this and other examples, the example memory device 100 may perform write operation modifications differently for different subarrays.

In another example, a memory device 100 may be additionally or alternatively be configured to support using a different write pulse 305 for each of a plurality of logic states (e.g., one write pulse 305 for writing a SET state and a different write pulse for writing a RESET state). For example, a memory device 100 may be initially configured to use the write pulse 305-c-1 for writing both a SET state and RESET state. In a representative population of memory cells 105, however, a threshold voltage migration of a configurable material may occur more rapidly for a RESET state than for a SET state (e.g., a distribution 220 may migrate at a faster rate than a distribution 210). Thus, write operations of the memory device 100 may accordingly be modified to use the write pulse 305-c-2 for writing the RESET state earlier than for writing the SET state. Thus, according to this and other examples, the example memory device 100 may perform write operation modifications differently for different logic states or material states.

Figure 4:
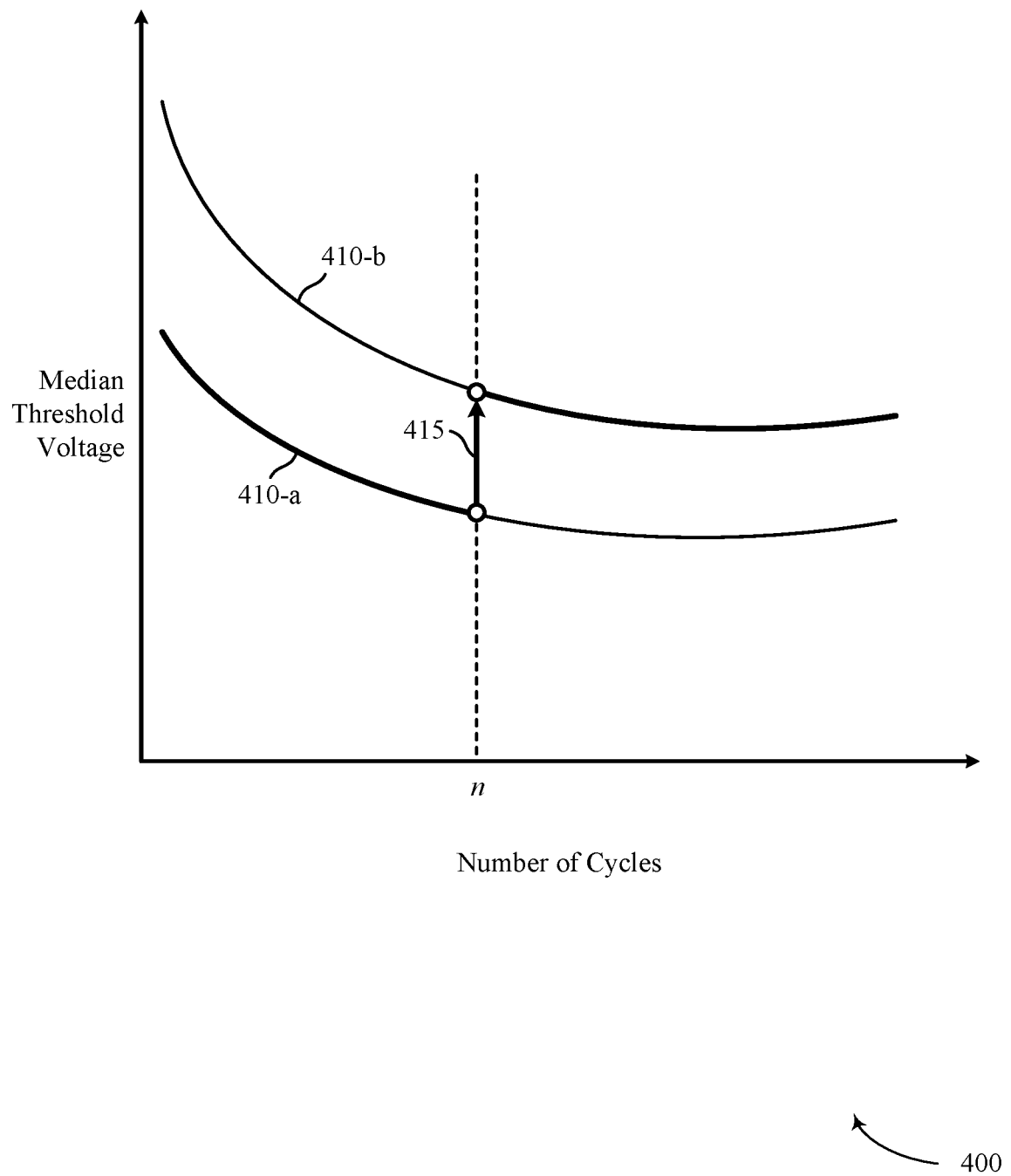
FIG. 4 illustrates an plot of threshold voltage migrations in a memory device in accordance with examples as disclosed herein.

FIG. 4 illustrates a plot 400 of threshold voltage migrations 410 in a memory device in accordance with examples as disclosed herein. The threshold voltage migrations 410 illustrate how a median threshold voltage (e.g., for a particular material state or logic state) may migrate over time in response to cycling. For the sake of illustration, the median threshold voltage as shown in each of the threshold voltage migrations 410 may correspond to a midpoint of a distribution 210 (e.g., of a SET state), or a midpoint of a distribution 220 (e.g., of a RESET state), as described with reference to FIG. 2, but may be more generally applicable to other examples of threshold voltage migration of a representative population of memory cells 105 (e.g., of a representative population of configurable material memory elements).

Each of the threshold voltage migrations 410-a and 410-b may correspond to write operations having respective parameters. For example, the threshold voltage migration 410-a may correspond to a write pulse 305 having a certain current amplitude and duration, and the threshold voltage migration 410-b may correspond to a write pulse 305 having a certain current amplitude and duration, where the current amplitude, or duration, or both for the threshold voltage migration 410-b may be different than those for the threshold voltage migration 410-a. For the sake of illustration, the threshold voltage migration 410-a may correspond to write operations using the write pulse 305-c-1, and the threshold voltage migration 410-b may correspond to write operations using the write pulse 305-c-2, as described with reference to FIG. 3, but the threshold voltage migrations 410-a and 410-b may be more generally applicable to other examples of write pulses 305, or differences between write pulses 305. According to the illustrative example, write operations using the write pulse 305-c-2 (e.g., according to higher pulse amplitudes and shorter pulse durations) may generally be associated with having a greater threshold voltage than write operations using the write pulse 305-c-1, but, as shown, threshold voltage migration in response to cycling may occur with either the write pulse 305-c-1 or the write pulse 305-c-2.

In one example, a memory device 100 may be initially configured to perform write operations using the write pulse 305-c-1. Accordingly, for a particular logic state or material state (e.g., a SET state or a RESET state), the median threshold voltage of memory cells 105 written with the particular logic state or material state may initially follow the path of the threshold voltage migration 410-a. However, in accordance with examples of the present disclosure, the memory device 100 may be configured to modify parameters of write operations based on identified or predicted aging or cycling.

For example, in accordance with the plot 400, the memory device 100 may be configured with a threshold quantity of n cycles. The memory device 100 may accumulate a count of cycles (e.g., in a register of the memory device 100), which may include counting a quantity of write operations, counting a quantity of read operations, counting a quantity of read or write operations, counting a weighted quantity of read and write operations, or counting some other accumulation of access operations performed on the memory device, or some portion thereof. A weighted quantity of read and write operations may take into account differences between read and write operations. For example, a write operation may be counted as one cycle and a read operation may be counted as a fraction (e.g., one tenth, one fifth, one third, one half) of one cycle. Additionally or alternatively, access operations may be weighted based at least in part on a corresponding temperature at which the access operation occurs, such as a detected ambient temperature or local temperature of the memory device 100 during the access operation. When the memory device 100 identifies that accumulated or counted quantity of cycles reaches or exceeds the threshold (e.g., n cycles), the memory device 100 may modify write operations to instead use the write pulse 305-c-2 (e.g., modifying a current level or amplitude of a current source, modifying a duration for coupling a current source with a memory cell 105). Thus, based at least in part on the identification, the memory device 100 may perform a modification 415 such that, for the particular logic state or material state, the median threshold voltage of memory cells 105 written with the particular logic state or material state subsequently follows the path of the threshold voltage migration 410-*b*.

Therefore, based at least in part on the modification 415, the memory device 100 may modify write operations to compensate for threshold voltage migration in the memory device 100 (e.g., using a write pulse 305 associated with relatively higher threshold voltages), which may stabilize threshold voltages for the particular logic state or material illustrated, or more generally, may stabilize threshold voltages for each of the logic states of the memory device. Accordingly, a modification 415 may be an example of modifying write operations in a manner that stabilizes or otherwise adjusts one or both of an E3 margin and an E1 margin to compensate for threshold voltage migration, which may improve performance of the memory device 100. Although only a single modification 415 is illustrated in the example of plot 400, a memory device 100 may be configured to perform more than one modification 415 over the course of the operation or lifetime of the memory device 100, such as additional modifications at different numbers of cycles (e.g., a first modification at n cycles and a second modification at some different number of cycles), or modifications that are based at least in part on other parameters.

Moreover, although the plot 400 illustrates an example of performing a modification 415 in response to a quantity of cycles, other characteristics or conditions may be additionally or alternatively be used to determine a modification 415. For example, threshold migrations for a write operation may be similarly mapped against operating temperatures (e.g., on a horizontal axis), and a modification 415 may be performed based at least in part on detected changes in operating temperature of a memory device 100. In general, modifications 415 in accordance with the present disclosure may be based at least in part on various detections or inferences of aging, migrations, drifting, change in operating conditions, or other changes in a memory device 100 that may be associated with a change in a developed threshold voltage in response to a write operation, among other changes. Thus, in accordance with these and other examples, a memory device 100 may modify a set of parameters for a write operation based at least in part on identifying or inferring a threshold voltage migration, which may support the memory device 100 compensating for various sources of threshold voltage migrations (e.g., compensating for threshold voltage migrations by modifying the parameters of the write operation).

Figure 5:
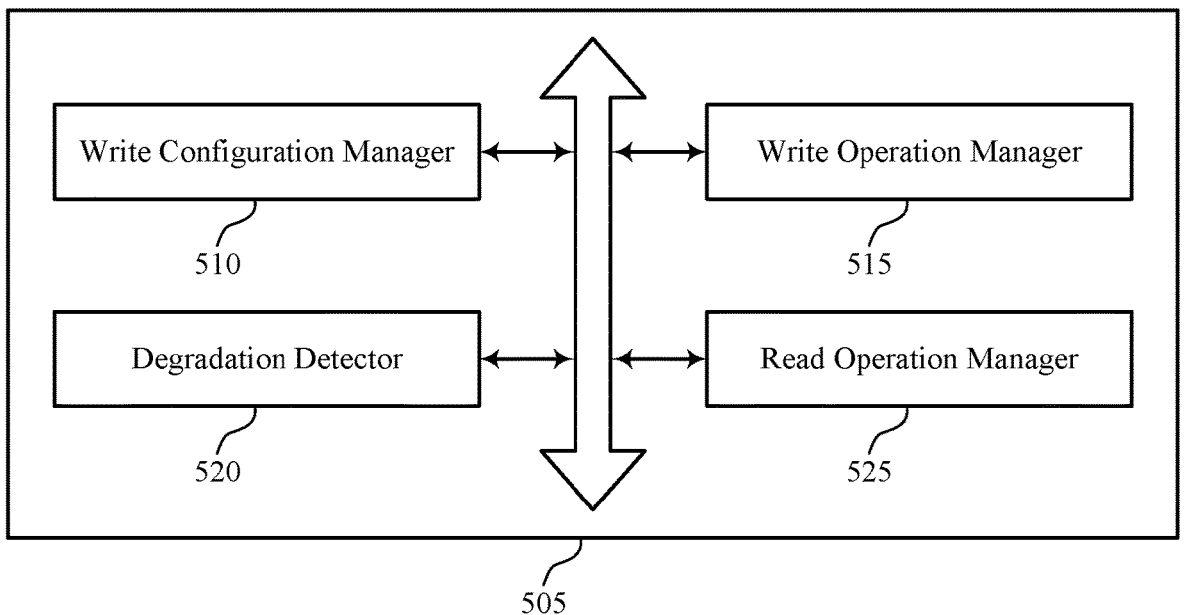
FIG. 5 shows a block diagram of a memory device that supports adaptive write operations for a memory device in accordance with examples as disclosed herein.

FIG. 5 shows a block diagram 500 of a memory device 505 that supports adaptive write operations for a memory device in accordance with examples as disclosed herein. The memory device 505 may be an example of aspects of a memory device 100 as described with reference to FIG. 1. The memory device 505 may include a write configuration manager 510, a write operation manager 515, a degradation detector 520, and a read operation manager 525. Each of these components may refer to a controller or circuitry configured to perform the described operations in the memory device 505, and each of these components may communicate, directly or indirectly, with one another (e.g., via one or more buses).

The write configuration manager 510 may modify one or more parameters for a write operation (e.g., based on an identified quantity of access operations, or other identification of aging, degradation, change in operating temperature or other condition, or other change in properties or responsive characteristics of memory cells). In some examples, the write configuration manager 510 may modify a current magnitude of the write operation, or a write pulse duration of the write operation, or a combination thereof. In some examples, the write configuration manager 510 may modify a first parameter corresponding to writing a first logic state and modify a second parameter corresponding to writing a second logic state (e.g., a different logic state than the first logic state).

In some examples, the write configuration manager 510 may modify one or more second parameters for a second write operation based on an identified second quantity of access operations. In some examples, modifying the one or more second parameters for the second write operation includes modifying the one or more modified parameters (e.g., performing serial modifications). In some cases, the one or more parameters are associated with writing a first logic state, and the one or more second parameters are associated with writing a second logic state (e.g., modifying parameters differently for different logic states).

The write operation manager 515 may write a logic state to one or more of the set of memory cells by performing the write operation according to the one or more modified parameters. In some examples, the write operation manager 515 may apply a first voltage having a first polarity to write a first logic state (e.g., to a first target memory cell), and apply a second voltage having a second polarity to write a second logic state (e.g., to a second target memory cell).

In some examples, the write operation manager 515 may perform a second write operation according to the one or more modified second parameters to write a logic state to one or more of the set of memory cells. In some examples, performing the write operation according to the one or more modified parameters includes performing the write operation on the first subset of the set of memory cells. In some examples, performing the write operation according to the one or more modified second parameters includes performing the write operation on the second subset of the set of memory cells. In other words, the write operation manager 515 may perform write operations on different subsets of memory cells according to different modifications (e.g., different identified quantities of access operations for respective subsets, different identified operating conditions for respective subsets).

The degradation detector 520 may identify a quantity of access operations performed on a memory array, or other identification of aging, degradation, or other change in properties or responsive characteristics of memory cells. In some examples, the degradation detector 520 may determine that the identified quantity of access operations exceeds a threshold. In some cases, the quantity of access operations corresponds to a quantity of write operations, read operations, or combination thereof, that are performed on the memory array. In some cases, the quantity of access operations corresponds to access operations performed on a subset of the set of memory cells. In some examples, the degradation detector 520 may identify some other characteristics of a memory array to identify aging, degradation, or other change in operating conditions, such as identifying that a quantity or rate of errors (e.g., access errors, read errors, write errors) exceeds or otherwise satisfies a threshold. More generally, the degradation detector 520 may be configured for identifying or inferring a threshold voltage migration of the memory device 505.

In some examples, the degradation detector 520 may identify a second quantity of access operations performed on the memory array. In some cases, the identified second quantity of access operations corresponds to access operations performed after identifying the quantity of access operations. In some cases, the second quantity of access operations is different than the quantity of access operations. In some cases, the identified quantity of access operations corresponds to access operations performed on a first subset of the set of memory cells, and the identified second quantity of access operations corresponds to access operations performed on a second subset of the set of memory cells.

The read operation manager 525 may perform a first read operation on one or more of the set of memory cells before modifying write parameters, and the first read operation may include applying a read voltage. In some examples, the read operation manager 525 may perform a second read operation on one or more of the set of memory cells after the modifying, where the second read operation includes applying the read voltage (e.g., a same voltage as before modifying write parameters).

Figure 6:
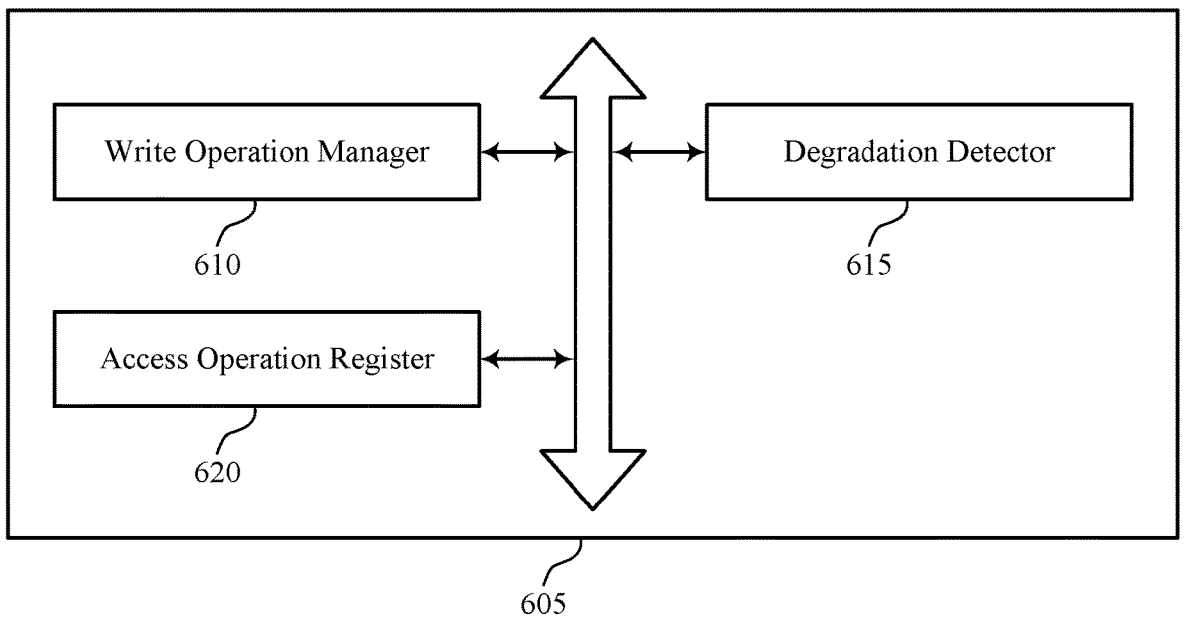
FIG. 6 shows a block diagram of a memory device that supports adaptive write operations for a memory device in accordance with examples as disclosed herein.

FIG. 6 shows a block diagram 600 of a memory device 605 that supports adaptive write operations for a memory device in accordance with examples as disclosed herein. The memory device 605 may be an example of aspects of a memory device 100 as described with reference to FIG. 1. The memory device 605 may include a write operation manager 610, a degradation detector 615, and an access operation register 620. Each of these components may refer to a controller or circuitry configured to perform the described operations in the memory device 605, and each of these components may communicate, directly or indirectly, with one another (e.g., via one or more buses).

The write operation manager 610 may perform one or more first write operations on a memory array according to a first pulse magnitude and a first pulse duration. In some examples, the write operation manager 610 may apply, to a first target memory cell to write a first logic state, a first voltage having a first polarity. In some examples, the write operation manager 610 may apply, to a second target memory cell to write a second logic state, a second voltage having a second polarity.

In some examples, the write operation manager 610 may perform, based on identifying that the quantity of access operations performed on the memory array satisfies the threshold, one or more second write operations on the memory array according to a second pulse magnitude and a second pulse duration. In some cases, the second pulse magnitude is greater than the first pulse magnitude, and the second pulse duration is shorter than the first pulse duration.

The degradation detector 615 may identify that a quantity of access operations performed on the memory array satisfies a threshold, or may identify some other indication of aging, degradation, or other change in properties or responsive characteristics of memory cells. In some examples, identifying that the quantity of access operations performed on the memory array satisfies the threshold includes comparing counted access operations to a configured threshold. In some examples, the degradation detector 615 may identify some other characteristics of a memory array to identify aging, degradation, or other change in operating conditions, such as identifying that a quantity or rate of errors (e.g., access errors, read errors, write errors) exceeds or otherwise satisfies a threshold. More generally, the degradation detector 615 may be configured for identifying or inferring a threshold voltage migration of the memory device 605.

The access operation register 620 may count access operations in a register corresponding to the memory array.

Figure 7:
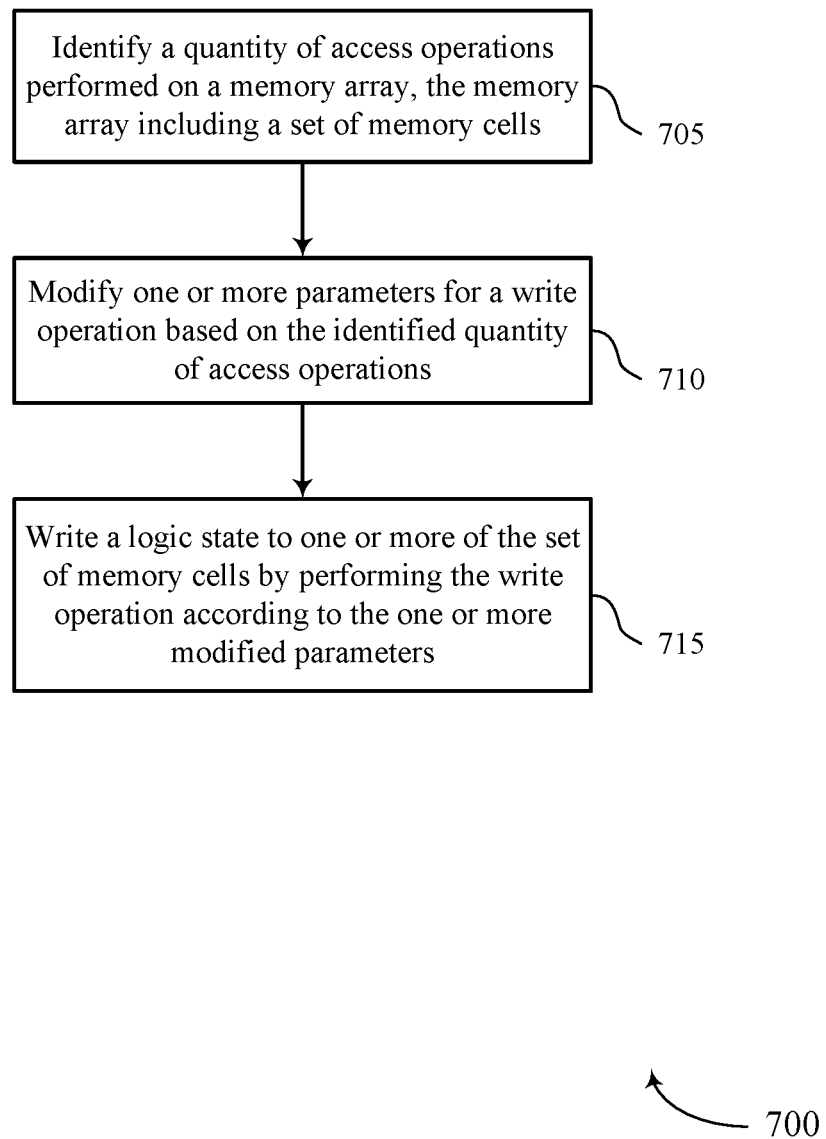
FIGS. 7 and 8 show flowcharts illustrating a method or methods that support adaptive write operations for a memory device in accordance with examples as disclosed herein.

FIG. 7 shows a flowchart illustrating a method or methods 700 that supports adaptive write operations for a memory device in accordance with examples as disclosed herein. The operations of method 700 may be implemented by a memory device or its components as described herein. For example, the operations of method 700 may be performed by a memory device 505 as described with reference to FIG. 5. In some examples, a memory device may execute a set of instructions to control the functional elements of the memory device to perform the described functions. Additionally or alternatively, a memory device may perform aspects of the described functions using special-purpose hardware or circuitry.

At 705, the memory device may identify a quantity of access operations performed on a memory array, the memory array including a set of memory cells. In some examples, each of the memory cells is associated with a respective memory element (e.g., configurable material portion) storing a value based on a change in a material property associated with the memory element. The operations of 705 may be performed according to the methods described herein. In some examples, aspects of the operations of 705 may be performed by a degradation detector as described with reference to FIG. 5.

At 710, the memory device may modify one or more parameters for a write operation based on the identified quantity of access operations. The operations of 710 may be performed according to the methods described herein. In some examples, aspects of the operations of 710 may be performed by a write configuration manager as described with reference to FIG. 5.

At 715, the memory device may write a logic state to one or more of the set of memory cells by performing the write operation according to the one or more modified parameters. The operations of 715 may be performed according to the methods described herein. In some examples, aspects of the operations of 715 may be performed by a write operation manager as described with reference to FIG. 5.

In some examples, an apparatus as described herein may perform a method or methods, such as the method 700. The apparatus may include features, means, circuitry, or instructions (e.g., a non-transitory computer-readable medium storing instructions executable by a processor) for identifying a quantity of access operations performed on a memory array, modifying one or more parameters for a write operation based on the identified quantity of access operations, and writing a logic state to one or more of the set of memory cells by performing the write operation according to the one or more modified parameters.

Some examples of the method 700 and the apparatus described herein may further include operations, features, means, circuitry, or instructions for determining that the identified quantity of access operations exceeds a threshold, where modifying the one or more parameters may be based on the determining.

In some examples of the method 700 and the apparatus described herein, the modifying the one or more parameters of the write operation may include operations, features, means, circuitry, or instructions for modifying a current magnitude of the write operation.

In some examples of the method 700 and the apparatus described herein, the modifying the one or more parameters of the write operation may include operations, features, means, circuitry, or instructions for modifying a write pulse duration of the write operation.

In some examples of the method 700 and the apparatus described herein, the modifying the one or more parameters of the write operation may include operations, features, means, circuitry, or instructions for modifying a first parameter corresponding to writing a first logic state, and modifying a second parameter corresponding to writing a second logic state.

In some examples of the method 700 and the apparatus described herein, performing the write operation may include operations, features, means, circuitry, or instructions for applying, to a first target memory cell to write a first logic state, a first voltage having a first polarity, and applying, to a second target memory cell to write a second logic state, a second voltage having a second polarity.

Some examples of the method 700 and the apparatus described herein may further include operations, features, means, circuitry, or instructions for identifying a second quantity of access operations performed on the memory array, modifying one or more second parameters for a second write operation based on the identified second quantity of access operations, and performing the second write operation according to the one or more modified second parameters to write a logic state to one or more of the set of memory cells.

In some examples of the method 700 and the apparatus described herein, the identified second quantity of access operations corresponds to access operations performed after identifying the quantity of access operations, and modifying the one or more second parameters for the second write operation may include operations, features, means, circuitry, or instructions for modifying the one or more modified parameters.

In some examples of the method 700 and the apparatus described herein, the second quantity of access operations may be different than the quantity of access operations.

In some examples of the method 700 and the apparatus described herein, the identified quantity of access operations corresponds to access operations performed on a first subset of the set of memory cells, the identified second quantity of access operations corresponds to access operations performed on a second subset of the set of memory cells. In some examples, performing the write operation according to the one or more modified parameters may include operations, features, means, circuitry, or instructions for performing the write operation on the first subset of the set of memory cells, and performing the write operation according to the one or more modified second parameters may include operations, features, means, circuitry, or instructions for performing the write operation on the second subset of the set of memory cells.

In some examples of the method 700 and the apparatus described herein, the one or more parameters may be associated with writing a first logic state, and the one or more second parameters may be associated with writing a second logic state.

Some examples of the method 700 and the apparatus described herein may further include operations, features, means, circuitry, or instructions for performing a first read operation on one or more of the set of memory cells before the modifying, where the first read operation includes applying a read voltage, and performing a second read operation on one or more of the set of memory cells after the modifying, where the second read operation includes applying the read voltage (e.g., the same read voltage as before the modifying).

In some examples of the method 700 and the apparatus described herein, the quantity of access operations corresponds to a quantity of write operations, read operations, or combination thereof performed on the memory array.

In some examples of the method 700 and the apparatus described herein, the quantity of access operations corresponds to access operations performed on a subset of the set of memory cells.

Although the example of method 700 is described in the context of quantities of access operations, modifying parameters for a write operation in accordance with the present disclosure may be additionally or alternatively based on some other characteristic or condition, such as an identified temperature of a memory device, a quantity or rate of errors of the memory device (e.g., access errors, read errors, write errors, errors indicative of a change in threshold voltages of written memory cells of the memory device), and others. Generally, modifications to parameters of a write operation in accordance with the present disclosure may be made based on any detection of conditions or characteristics that correspond to an actual or inferred change or migration in threshold voltages, or other material characteristics or responsive behaviors of a memory device.

Figure 8:
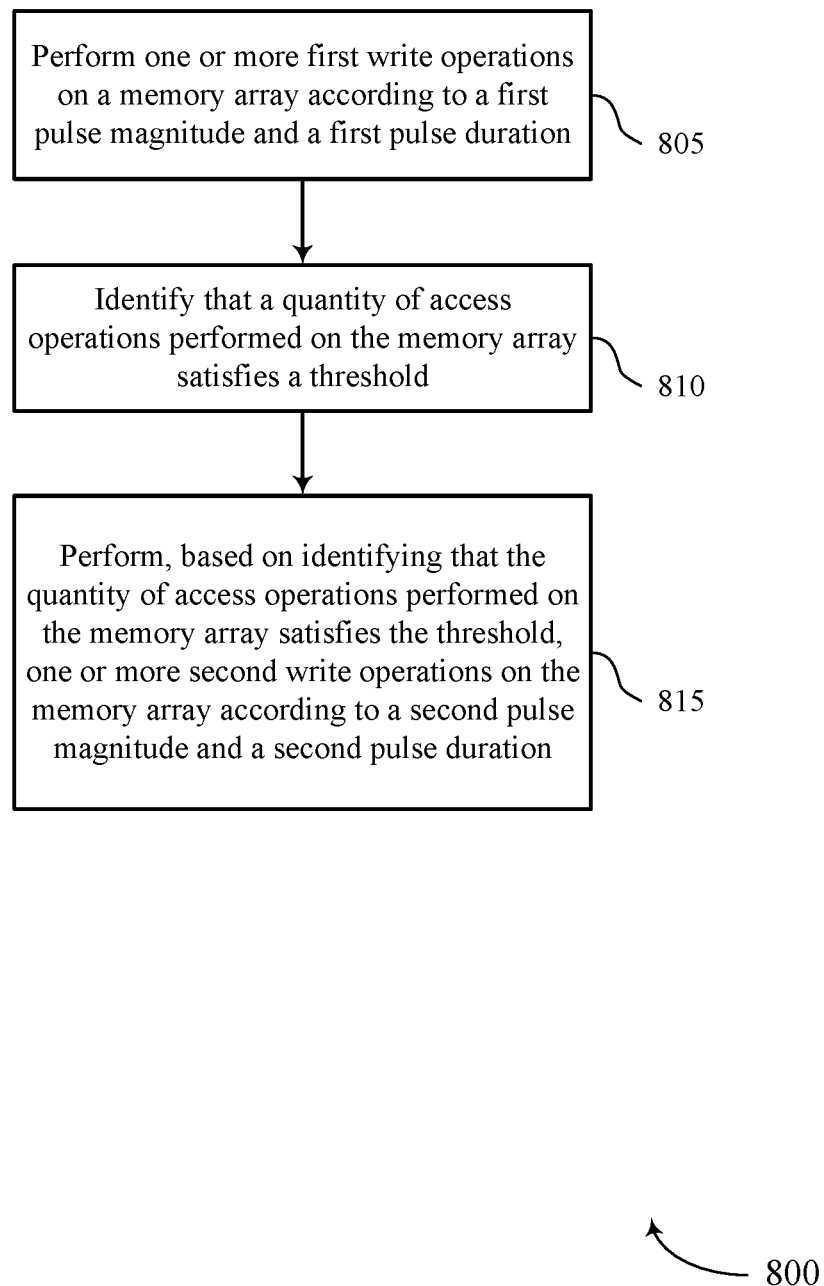

FIG. 8 shows a flowchart illustrating a method or methods 800 that supports adaptive write operations for a memory device in accordance with examples as disclosed herein. The operations of method 800 may be implemented by a memory device or its components as described herein. For example, the operations of method 800 may be performed by a memory device 605 as described with reference to FIG. 6. In some examples, a memory device may execute a set of instructions to control the functional elements of the memory device to perform the described functions. Additionally or alternatively, a memory device may perform aspects of the described functions using special-purpose hardware or circuitry.

At 805, the memory device may perform one or more first write operations on a memory array according to a first pulse magnitude and a first pulse duration. The operations of 805 may be performed according to the methods described herein. In some examples, aspects of the operations of 805 may be performed by a write operation manager as described with reference to FIG. 6.

At 810, the memory device may identify that a quantity of access operations performed on the memory array satisfies a threshold. The operations of 810 may be performed according to the methods described herein. In some examples, aspects of the operations of 810 may be performed by a degradation detector as described with reference to FIG. 6.

At 815, the memory device may perform, based on identifying that the quantity of access operations performed on the memory array satisfies the threshold, one or more second write operations on the memory array according to a second pulse magnitude and a second pulse duration. The operations of 815 may be performed according to the methods described herein. In some examples, aspects of the operations of 815 may be performed by a write operation manager as described with reference to FIG. 6.

In some examples, an apparatus as described herein may perform a method or methods, such as the method 800. The apparatus may include features, means, circuitry, or instructions (e.g., a non-transitory computer-readable medium storing instructions executable by a processor) for performing one or more first write operations on a memory array according to a first pulse magnitude and a first pulse duration, identifying that a quantity of access operations performed on the memory array satisfies a threshold, and performing, based on identifying that the quantity of access operations performed on the memory array satisfies the threshold, one or more second write operations on the memory array according to a second pulse magnitude and a second pulse duration.

In some examples of the method 800 and the apparatus described herein, the second pulse magnitude may be greater than the first pulse magnitude, and the second pulse duration may be shorter than the first pulse duration.

Some examples of the method 800 and the apparatus described herein may further include operations, features, means, circuitry, or instructions for counting access operations in a register corresponding to the memory array, and identifying that the quantity of access operations performed on the memory array satisfies the threshold may include comparing the counted access operations to a configured threshold.

In some examples of the method 800 and the apparatus described herein, performing the one or more second write operations may include operations, features, means, circuitry, or instructions for applying, to a first target memory cell to write a first logic state, a first voltage having a first polarity, and applying, to a second target memory cell to write a second logic state, a second voltage having a second polarity.

Although the example of method 800 is described in the context of quantities of access operations, modifying parameters for a write operation in accordance with the present disclosure may be additionally or alternatively based on some other characteristic or condition, such as an identified temperature of a memory device, a quantity or rate of errors of the memory device (e.g., access errors, read errors, write errors, errors indicative of a change in threshold voltages of written memory cells of the memory device), and others. Generally, modifications to parameters of a write operation in accordance with the present disclosure may be made based on any detection of conditions or characteristics that correspond to an actual or inferred change or migration in threshold voltages, or other material characteristics or responsive behaviors of a memory device.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array including a set of memory cells. In some examples, each of the memory cells may be associated with a respective memory element storing a value based on a change in a material property associated with the memory element. The apparatus may also include circuitry configured to identify that a quantity of access operations performed on the memory array exceeds a threshold, modify one or more parameters of a write operation based on the identifying, and write a logic state to one or more of the set of memory cells by performing the write operation according to the one or more modified parameters.

In some examples, to modify the one or more parameters, the circuitry may be configured to modify a current magnitude of the write operation, a write pulse duration of the write operation, or both.

In some examples, to modify the one or more parameters, the circuitry may be configured to perform a first modification to a parameter corresponding to writing a first logic state, and perform a second modification to a second parameter corresponding to writing a second logic state.

In some examples, to perform the write operation, the circuitry may be configured to apply, to a first target memory cell to write a first logic state, a first voltage having a first polarity, and apply, to a second target memory cell to write a second logic state, a second voltage having a second polarity.

In some examples, the circuitry may be configured to identify that a second quantity of access operations, performed on the memory array after modifying the one or more parameters, exceeds a second threshold, modify the one or more modified parameters, based on identifying that the second quantity of access operations exceeds the second threshold, to generate one or more modified second parameters, and perform the write operation according to the one or more modified second parameters to write a logic state to one or more of the set of memory cells.

In some examples, the first quantity of access operations corresponds to access operations performed on a first subset of the plurality of memory cells, and to perform the write operation according to the one or more modified parameters, the circuitry is configured to perform the write operation on a set of memory cells that includes the first subset of the plurality of memory cells. In some examples, the circuitry may be further configured to identify that a second quantity of access operations performed on a second subset of the set of memory cells exceeds a second threshold, modify one or more second parameters of the write operation based on identifying that the second quantity of access operations exceeds the second threshold, and perform the write operation according to the one or more modified second parameters to write a logic state to one or more of a set of memory cells that includes the second subset of the set of memory cells.

In some examples, the one or more parameters are associated with writing a first logic state associated with a threshold voltage being below a read voltage, and to perform the write operation according to the one or more modified parameters, the circuitry is configured to write the first logic state. In some examples, the circuitry may be further configured to identify that a second quantity of access operations performed on the set of memory cells exceeds a second threshold, modify one or more second parameters of a write operation, associated with writing a second logic state associated with a threshold voltage being above a read voltage, based on identifying that the second quantity of access operations exceeds the second threshold, and perform the write operation according to the one or more modified second parameters to write the second logic state to one or more of the set of memory cells.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    receiving a plurality of commands associated with performing access operations on a memory array;
    counting a first set of access operations performed on the memory array as a result of receiving a first portion of commands from the plurality of commands to obtain a first quantity of the access operations, the memory array comprising a plurality of memory cells each associated with a respective memory element storing a value based at least in part on a change in a material property associated with the memory element, wherein the first quantity of the access operations comprises a quantity of write operations and a quantity of read operations;
    modifying one or more first parameters for a first write operation based at least in part on the first quantity of the access operations;
    writing a first logic state to one or more of the plurality of memory cells by performing the first write operation according to the one or more first modified parameters;
    counting a second set of access operations performed on the memory array as a result of receiving a second portion of commands from the plurality of commands to obtain a second quantity of the access operations;
    modifying one or more second parameters for a second write operation based at least in part on the second quantity of the access operations; and
    writing a second logic state to one or more of the plurality of memory cells by performing the second write operation according to the one or more second modified parameters, wherein the second set of access operations corresponding to the second quantity of the access operations is performed after the first set of access operations corresponding to the first quantity of the access operations.

2. The method of claim 1, further comprising:
    determining that the first quantity of the access operations exceeds a threshold, wherein modifying the one or more first parameters is based at least in part on the determining.

3. The method of claim 1, wherein the modifying the one or more first parameters of the first write operation comprises:
    modifying a current magnitude of the first write operation.

4. The method of claim 1, wherein the modifying the one or more first parameters of the first write operation comprises:
    modifying a write pulse duration of the first write operation.

5. The method of claim 1, wherein the modifying the one or more first parameters of the first write operation comprises:
    modifying a third parameter corresponding to writing a third logic state; and
    modifying a fourth parameter corresponding to writing a fourth logic state.

6. The method of claim 1, wherein performing the first write operation and the second write operation comprises:
    applying, to a first target memory cell to write the first logic state, a first voltage having a first polarity; and
    applying, to a second target memory cell to write the second logic state, a second voltage having a second polarity.

7. The method of claim 1, wherein:
    modifying the one or more second parameters for the second write operation comprises modifying the one or more first parameters.

8. The method of claim 7, wherein the second quantity of the access operations is different than the first quantity of the access operations.

9. The method of claim 1, wherein:
    the first quantity of the access operations corresponds to access operations performed on a first subset of the plurality of memory cells;
    the second quantity of the access operations corresponds to access operations performed on a second subset of the plurality of memory cells;
    performing the first write operation according to the one or more first modified parameters comprises performing the first write operation on the first subset of the plurality of memory cells; and performing the second write operation according to the one or more modified second parameters comprises performing the second write operation on the second subset of the plurality of memory cells.

10. The method of claim 1, wherein the one or more first parameters are associated with writing the first logic state, and the one or more second parameters are associated with writing the second logic state.

11. The method of claim 1, further comprising:
performing a first read operation on one or more of the plurality of memory cells before the modifying of the one or more first parameters, wherein the first read operation comprises applying a read voltage; and
performing a second read operation on one or more of the plurality of memory cells after the modifying of the one or more second parameters, wherein the second read operation comprises applying the read voltage.

12. The method of claim 1, wherein the first quantity of the access operations corresponds to a quantity of access operations performed on the memory array.

13. The method of claim 1, wherein the first quantity of the access operations corresponds to access operations performed on a subset of the plurality of memory cells.

14. An apparatus, comprising:
a memory array comprising a plurality of memory cells each associated with a respective memory element storing a value based at least in part on a change in a material property associated with the memory element; and
circuitry configured to:
receive a plurality of commands associated with performing access operations on the memory array;
count a first set of access operations performed on the memory array as a result of receiving a first portion of commands from the plurality of commands to obtain a first quantity of the access operations;
identify that the first quantity of the access operations performed on the memory array exceeds a first threshold, wherein the first quantity of the access operations comprises a quantity of write operations and a quantity of read operations;
modify one or more first parameters of a first write operation based at least in part on exceeding the first threshold; and
write a first logic state to one or more of the plurality of memory cells by performing the first write operation according to the one or more first modified parameters;
count a second set of access operations performed on the memory array as a result of receiving a second portion of commands from the plurality of commands to obtain a second quantity of the access operations;
identify that the second quantity of the access operations performed on the memory array exceeds a second threshold;
modify one or more second parameters for a second write operation based at least in part on exceeding the second threshold; and
write a second logic state to one or more of the plurality of memory cells by performing the second write operation according to the one or more second modified parameters, wherein the second set of access operations corresponding to the second quantity of the access operations is performed after the first set of access operations corresponding to the first quantity of the access operations.

15. The apparatus of claim 14, wherein, to modify the one or more first parameters, the circuitry is configured to:
modify a current magnitude of the first write operation, a write pulse duration of the first write operation, or both.

16. The apparatus of claim 14, wherein, to modify the one or more first parameters, the circuitry is configured to:
perform a first modification to a third parameter corresponding to writing a third logic state; and
perform a second modification to a fourth parameter corresponding to writing a fourth logic state.

17. The apparatus of claim 14, wherein, to perform the first write operation, the circuitry is configured to:
apply, to a first target memory cell to write the first logic state, a first voltage having a first polarity; and
apply, to a second target memory cell to write the second logic state, a second voltage having a second polarity.

18. The apparatus of claim 14, wherein:
modify the one or more second modified parameters for the second write operation comprises modifying the one or more first parameters.

19. The apparatus of claim 14, wherein modifying the one or more first parameters is further based at least in part on a threshold voltage being below a read voltage, and
wherein modifying the one or more second parameters of the second write operation is further based at least in part on the threshold voltage being above the read voltage.

* * * * *